United States Patent
Li

(10) Patent No.: US 7,564,130 B1
(45) Date of Patent: Jul. 21, 2009

(54) POWER MICRO SURFACE-MOUNT DEVICE PACKAGE

(75) Inventor: Felix C. Li, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/774,473

(22) Filed: Jul. 6, 2007

(51) Int. Cl.
  *H01L 23/48* (2006.01)
  *H01L 23/52* (2006.01)
  *H01L 29/49* (2006.01)

(52) U.S. Cl. .............. 257/734; 257/E23.126; 257/E23.128; 257/E21.511; 257/737; 257/738; 257/772; 257/778; 257/775; 257/776; 257/779; 257/780

(58) Field of Classification Search ........ 257/734, 257/737, 738, 778, 772, 775, 776, 779, 780, 257/E23.125, E23.128, E21.511
See application file for complete search history.

(56) References Cited

U.S. PATENT DOCUMENTS

| | | | |
|---|---|---|---|
| 5,214,308 A * | 5/1993 | Nishiguchi et al. .......... 257/692 |
| 6,699,732 B2 | 3/2004 | Hilton |
| 6,737,752 B2 | 5/2004 | Hilton |
| 6,956,291 B1 | 10/2005 | Li |
| 7,069,638 B2 * | 7/2006 | Akram .................... 29/595 |
| 7,211,934 B2 * | 5/2007 | Fujiwara et al. ............ 310/348 |
| 2004/0113215 A1 * | 6/2004 | Shimada et al. ............ 257/414 |
| 2005/0179128 A1 * | 8/2005 | Shioga et al. ................ 257/724 |
| 2006/0220500 A1 * | 10/2006 | Shimada et al. ............. 310/348 |
| 2007/0224722 A1 * | 9/2007 | Matthews et al. ............ 438/64 |
| 2008/0018423 A1 * | 1/2008 | Matsui et al. ................ 335/126 |

OTHER PUBLICATIONS

Liu et al., "Enhancing the Reliability of Wafer Level Packaging by Using Solder Joints Layout Design", IEEE Transactions on Components and Packaging Technologies, vol. 29, No. 4, Dec. 2006, pp. 877-885.
"Power Packages to 263", PSI Technologies, Inc., http://www.psitechnologies.com/products/to263.pip, 2 pages.
"Packaging—National ts3b Package", National Semiconductor, http://www.national.com/packaging/folders/ts3b.html, 4 pages.
"Packaging—National ts5b Package", National Semiconductor, http://www.national.com/packaging/folders/ts5b.html, 4 pages.
"Packaging—National ts7b Package", National Semiconductor, http://www.national.com/packaging/folders/ts7b.html, 4 pages.
"Packaging—National ts9b Package", National Semiconductor, http://www.national.com/packaging/folders/ts9b.html, 4 pages.

* cited by examiner

*Primary Examiner*—Alexander O Williams
(74) *Attorney, Agent, or Firm*—Beyer Law Group LLP

(57) ABSTRACT

A semiconductor device is provided, which comprises: a die including an active surface; a multiplicity of bond pads formed on the active surface of the die, wherein a first one of the bond pads is larger than a second one of the bond pads; and a multiplicity of solder bumps, each formed over a corresponding bond pad, wherein the multiplicity of solder bumps include a first solder bump formed over the first bond pad and a second solder bump formed over the second bond pad, the first solder bump having a footprint that is substantially larger than the second solder bump and a maximum diameter that is substantially larger than the second solder bump.

16 Claims, 4 Drawing Sheets

POWER MICRO SURFACE-MOUNT DEVICE PACKAGE

FIELD OF THE INVENTION

The present invention generally relates to the packaging of integrated circuits. More particularly, the invention relates to the formation of solder bumps suitable for use in integrated circuit packaging.

BACKGROUND OF THE INVENTION

There are a number of conventional processes for packaging integrated circuits. In many situations it is desirable to form solder bumps directly on an integrated circuit die. Typically, the solder bumps are formed on the active surface of the wafer before the individual dice are cut (singulated) from the wafer. When the resulting die is mounted on a substrate or other appropriate carrier, the solder bumps may be reflowed to create electrical connections to the die. This style of electrically connecting integrated circuits is often called "flip chip" mounting, because the die frequently must be "flipped" to place its active surface containing solder bumps into contact with the substrate to which the chip is to be attached. As integrated circuit devices and packaging get smaller and smaller, there are more situations where a flip chip type mounting is desirable.

One type of packaged integrated circuit device is commonly referred to as a "power package." Generally power packages include semiconductor devices having pins or lines that carry much higher currents (and sometimes higher voltages) than typical semiconductor devices. At the same time, many power devices also have signal lines that must be able to accommodate relatively high speeds. Due to a number of constraints, flip chip packaging techniques have not been widely used in power packages. Accordingly, although existing surface mount techniques work well, there are continuing efforts to develop even more efficient designs and methods for surface mounting the integrated circuit components in order to accommodate many different application requirements including the unique challenges of power packages.

SUMMARY OF THE INVENTION

Broadly speaking, in one aspect, the present invention relates to the formation of solder bumps for use in integrated circuit packaging. In another aspect, the present invention relates to a packaging system that connects the die to a substrate using the solder bumps.

In one embodiment, a semiconductor device is provided, which comprises: a die including an active surface; a multiplicity of bond pads formed on the active surface of the die, wherein a first one of the bond pads is larger than a second one of the bond pads; and a multiplicity of solder bumps, each formed over a corresponding bond pad, wherein the multiplicity of solder bumps include a first solder bump formed over the first bond pad and a second solder bump formed over the second bond pad, the first solder bump having a footprint that is substantially larger than the second solder bump and a maximum diameter that is substantially larger than the second solder bump.

In another embodiment, a semiconductor package is provided, which comprises: a semiconductor device comprising a die including an active surface; a multiplicity of bond pads formed on the active surface of the die, wherein a first one of the bond pads is larger than a second one of the bond pads; and a multiplicity of solder bumps, each formed over a corresponding bond pad, wherein the multiplicity of solder bumps include a first solder bump formed over the first bond pad and a second solder bump formed over the second bond pad, the first solder bump having a footprint that is substantially larger than the second solder bump and a maximum diameter that is substantially larger than the second solder bump; and a substrate comprising a multiplicity of contact pads formed on a surface of the substrate, wherein a first one of the contact pads is larger than a second one of the contact pads at least one power line, each connected to a corresponding first contact pad; at least one ground line, each connected to a corresponding first contact pad; and at least one signal line, each connected to a corresponding second contact pad, wherein the semiconductor device is mounted on the surface of the substrate, such that each of the multiplicity of solder bumps of the semiconductor device is connected to a corresponding contact pad of the substrate, wherein the first solder bump of the semiconductor device is connected to a corresponding first contact pad, and the second solder bump of the semiconductor device is connected to a corresponding second contact pad.

In another embodiment a method of mounting a die to a substrate is provided, which comprises: placing the die having a multiplicity of solder bumps of two different sizes on the substrate having a multiplicity of contact pads having two different sizes, wherein a larger solder bump corresponds to a larger contact pad, and a smaller solder bump corresponds to a smaller contact pad; and reflowing the multiplicity of solder bumps to connect the die to the substrate, wherein connections formed by reflowing the multiplicity of solder bumps have approximately the same height.

These and other features, aspects, and advantages of the invention will be described in more detail below in the detailed description and in conjunction with the following figures.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE DRAWINGS

The present invention generally relates to the packaging of integrated circuits. More particularly, the invention relates to the formation of solder bumps suitable for use in integrated circuit packaging. Generally, dice are formed that have different sized I/O pads on their active surface. The I/O pads may be bond pads formed directly on the active surface of the die, or redistributed in accordance with conventional redistribution techniques. In preferred arrangements, the I/O pads may take the form of under-bump metallization pads.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

With traditional flip chip technology, the solder bumps formed on the integrated circuit dice are generally of substantially the same size and shape. However, this characteristic has hindered the use of flip chip packaging techniques in power packages. This is due, in part, to the fact that relatively smaller solder bumps may not have the capacity to carry the currents required by various power packages (e.g. currents of at least 10 Amperes) and relatively larger solder bumps may not be suitable for use in many situations. For example, if all of the solder bumps are relatively large, then there may be real estate issues on the top surface (e.g. active surface) of the die, which may necessitate the use of larger die sizes. Alternatively, large solder bumps are sometimes considered inappropriate for use with high speed signal lines. These and other concerns have hindered the use of flip chip type packaging in power packages.

To address this problem, in one embodiment, solder bumps of different sizes and shapes are formed on a single die so that when the solder bumps are reflowed after the die is applied to a substrate, they created different types of connections between the die and the substrate. Generally, the larger solder bumps result in electrical connections that may be able to carry relatively higher currents, such as connections to ground or power lines, while the smaller solder bumps result in electrical connections that may be suitable for use as connections to signal lines.

Figure 1A:
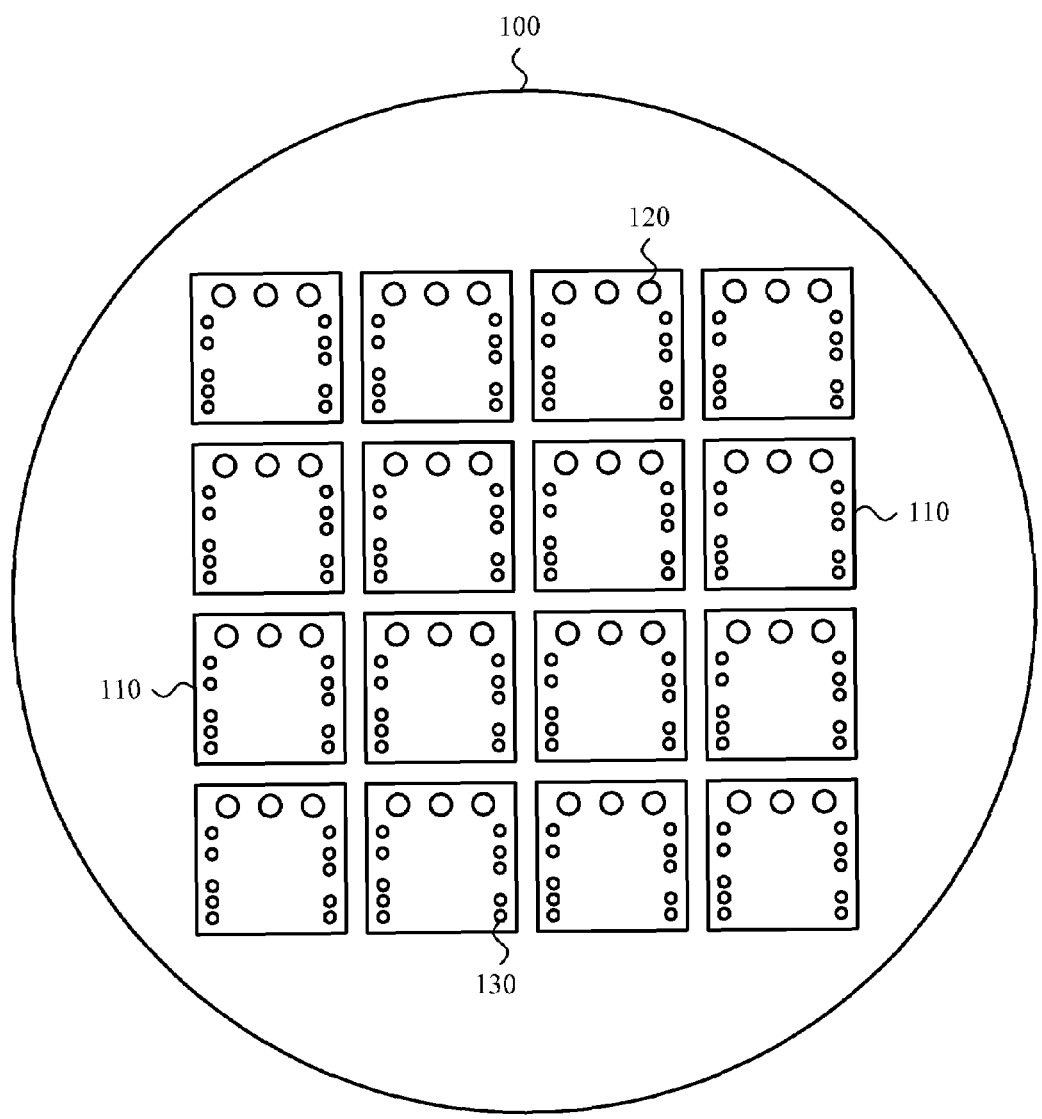
FIG. 1A is a diagrammatic top view illustrating the active surface of a wafer having multiple dice, each die with multiple solder bumps formed thereon.

FIG. 1A is a diagrammatic top view illustrating the active surface of a wafer formed in accordance with one embodiment of the present invention. The wafer 100 is formed from a semiconductor material, such as silicon and has multiple dice 110 formed therein. The wafer 100 has an active surface and a back surface. In the diagrammatic illustration, only a few dice are shown. However, as will be appreciated by those familiar with the art, state of the art wafers tend to have on the order of hundreds, to thousands or tens of thousands of dice formed therein and it is expected that even higher device densities will be attained in future wafers. Each die 110 will become an integrated circuit component after it is singulated from the wafer 100.

Generally, each die 110 on the wafer 100 will have a number of I/O pads (often referred to as bond pads) formed thereon. For flip chip packaging, under-bump metallization stacks may be formed on the bond pads to support solder bumps 120, 130 that are mounted directly over the I/O pads. Alternatively, the I/O pads may be redistributed using conventional redistribution techniques. Each die 110 has a multiplicity of solder bumps 120, 130 formed on the active surface of the die over the under-bump metallization or I/O pads or bond pads. The solder bumps 120, 130 are of different sizes and shapes, some larger 120 and others smaller 130.

Figure 1B:
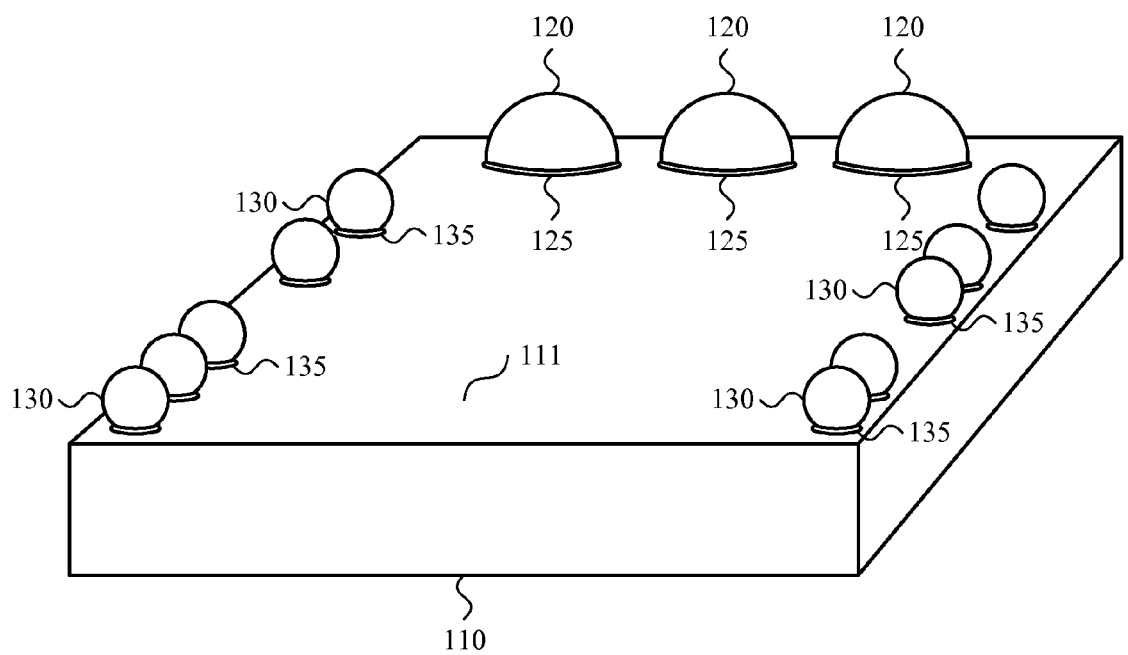
FIG. 1B is a diagrammatic view illustrating one of the dice from the wafer shown in FIG. 1A, with multiple solder bumps formed on its active surface.

To show the solder bumps in more detail, FIG. 1B is a diagrammatic view illustrating one of the dice from the wafer shown in FIG. 1A. The die 110 has an active surface 111, and metal bond pads 125, 135 may be formed on the active surface to support the solder bumps 120, 130. The bond pads 125, 135 may be copper or aluminum.

The metal bond pads 125, 135 may vary in size corresponding to the sizes of the solder bumps 120, 130 they support respectively. Generally, larger bond pads 125 are associated with larger solder bumps 120, and smaller bond pads 135 are associated with smaller solder bumps 130. Usually, the size of the bond pads 125, 135 are approximately the same as the portion of the corresponding solder bumps 120, 130 in contact with the bond pads 125, 135. It is also possible, although rarely, for the side of the bond pads 125, 135 to be slightly larger than the portion of the corresponding solder bumps 120, 130 in contact with the bond pads 125, 135.

The metal bond pads 125, 135 may also vary in shape, again corresponding to the shapes of the solder bumps 120, 130 they support respectively. Generally, the bond pads 125, 135 are circular in shape.

Each solder bump 120, 130 has a footprint, which is approximate the size of the portion of the solder bump 120, 130 in contact with the bond pads 125, 135. Thus, larger solder bumps 120 have larger footprints, and smaller solder bumps 130 have smaller footprints.

Often, although optionally, under-bump metallization (UBM) stacks may be formed over the bond pads in support of the solder bumps, and if under-bump metallization stacks are present, then the solder bumps are formed over them. The under-bump metallization stacks may be multiple layers of different materials, such as tungsten, copper, or nickel vanadium. Usually, the under-bump metallization stacks vary in size and shape corresponding to the sizes and shapes of the bond pads.

The solder bumps 120, 130 vary in shape. In one embodiment, the larger solder bumps 120 are approximately hemispherical in shape, and the smaller solder bumps 130 are approximately spherical cap in shape. A spherical cap is the region of a sphere which lies above or below a give plane. A spherical cap may either be major or minor. A major spherical cap is a portion of a sphere that is greater than a hemisphere, and a minor spherical cap is a portion of a sphere that is less than a hemisphere. The term "spherical cap" as used here describes the shape 130 as shown in FIG. 1B, where a small portion near the bottom of a sphere is "sliced off" (by the bond pad) while the rest of the sphere remains intact. Shape 130 may also be referred to as a major spherical cap.

The solder bumps 120, 130 also vary in size. In one embodiment, the radius of the larger solder bumps 120 approximately equals the diameter of the smaller solder bumps 130. Since the larger solder bumps 120 are approximately hemispherical in shape and the smaller solder bumps 130 are approximately spherical cap in shape, the height of the larger solder bumps 120 (i.e., its radius) and the height of the smaller solder bumps 130 (i.e., its diameter) are approximately the same. It is desirable that the height of the larger solder bumps 120 and the height of the smaller solder bumps 130 are equal. However, the design may still function when the difference between the height of the larger solder bumps 120 and the height of the smaller solder bumps 130 is as much as 2 or 3 mils.

Figure 2:
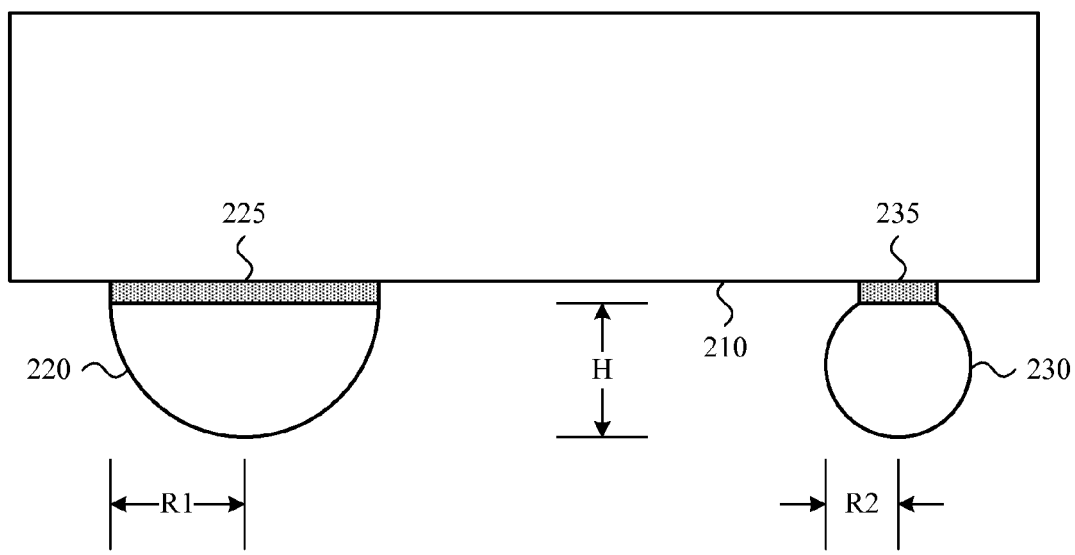
FIG. 2 is a diagrammatic side view illustrating a die with one larger and one smaller solder bumps formed on its active surface.

To further illustrates the dimensional relationships of the larger solder bumps 120 and the smaller solder bumps 130 shown in FIGS. 1A and 1B, FIG. 2 is a diagrammatic side view illustrating a die with one larger and one smaller solder bumps formed on its active surface.

First, with respect to the larger solder bump 220, a bond pad 225 is formed on the active surface of the die 210, and the larger solder bump 220 is formed over the bond pad 225. The bond pad 225 is large enough to support the larger solder bump 220. The larger solder bump 220 is approximately hemispherical in shape, with its base facing the bond pad 225. The larger solder bump 220 has a radius, R1, and a height H that approximately equals its radius R1.

Next, with respect to the smaller solder bump 230, a bond pad 235 is formed on the active surface of the die 210, and the smaller solder bump 230 is formed over the bond pad 235. The bond pad 235 is relatively smaller because it only needs to support a relatively smaller solder bump 230. The smaller solder bump 230 is approximately spherical cap in shape, where a small portion of the sphere in contact with the bond pad 235 is "sliced off" by the bond pad. It has a radius, R2, and a height H that is approximately two times or twice its radius R2 (i.e., its diameter).

The height, H, of the larger solder bump 220, and the height, H, of the smaller solder bump 230 are approximately the same, which implies that the radius, R1, of the larger solder bump 220, is approximately two times or twice the radius, R2, of the smaller solder bump 230, or that the radius, R1, of the larger solder bump 220, approximately equals the diameter of the smaller solder bump 230. By maintaining the height, H, of the larger solder bump 220, and the height, H, of the smaller solder bump 230 to be approximately the same, the die 210 may eventually be applied to a substrate evenly for mounting and/or packaging.

The actual sizes of the larger and smaller solder bumps 220, 230 may be determined based on actual application requirements and/or experimentations and may vary among different designs of the integrated circuit components. However, it is preferable to maintain the dimensional relationship between the larger and smaller solder bumps 220, 230 as described above.

As illustrated in FIG. 2, the footprint of the larger solder bump 220 is approximately the size of its corresponding bond pad 225, and the footprint of the smaller solder bump 230 is approximately the size of its corresponding bond pad 235. Thus, the size of the footprint of the larger solder bump 220 is more than twice the size of the footprint of the smaller solder bump 230.

Figure 3A:
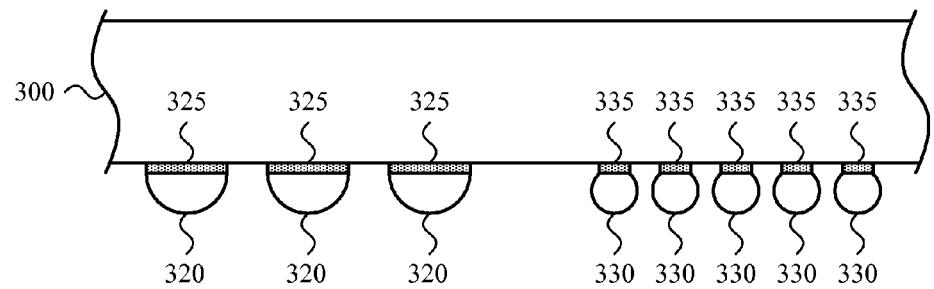
FIG. 3A is a diagrammatic side view of a wafer with multiple solder bumps formed on its active surface.

For surface-mount packaging, typically, the solder bumps are formed directly to the active surface of a wafer (i.e., at wafer level) before the dice are singulated from the wafer. FIG. 3A is a diagrammatic side view of a wafer with multiple solder bumps formed on its active surface. There are different methods to form solder bumps on a wafer (referred to as "wafer bumping"). For example, stencil printing, electroplating, and evaporation are some of the widely employed wafer bumping technologies that may be used to form solder bumps 320, 330 on the wafer 300 shown in FIG. 3A. Other wafer bumping technologies may also be used. In addition, different types of solder material may be used to form the solder bumps 320, 330 depending on the specific design and/or application requirements. However, regardless of which type of wafer bumping technology is utilized, multiple solder bumps 320, 330 of different sizes and shapes are formed on the active surface of the wafer 300, each solder bump 320, 330 over a corresponding under-bump metallization (UBM) or bond pad 325, 335.

Again, the larger solder bumps 320 are formed over relatively larger bond pads 325 and are approximately hemispherical in shape. The smaller solder bumps 330 are formed over relatively smaller bond pads 335 and are approximately spherical cap in shape.

The heights of the larger solder bumps 320 and the smaller solder bumps 330 are approximately the same. The purpose to maintain height consistency between the larger solder bumps 320 and the smaller solder bumps 330 is that after the die is singulated and applied to a substrate and when the solder bumps 320, 330 are reflowed to create connections between the die and the substrate, the resulting connections are even (i.e., having approximately the same height) so that the die rests evenly against the substrate. Therefore, it is not necessary that when the solder bumps 320, 330 are formed on the wafer, their heights are exactly the same. Slight variations in heights may be tolerated as long as after the solder bumps 320, 330 are reflowed, they result in even and consistent connections between the die and the substrate.

Figure 3B:
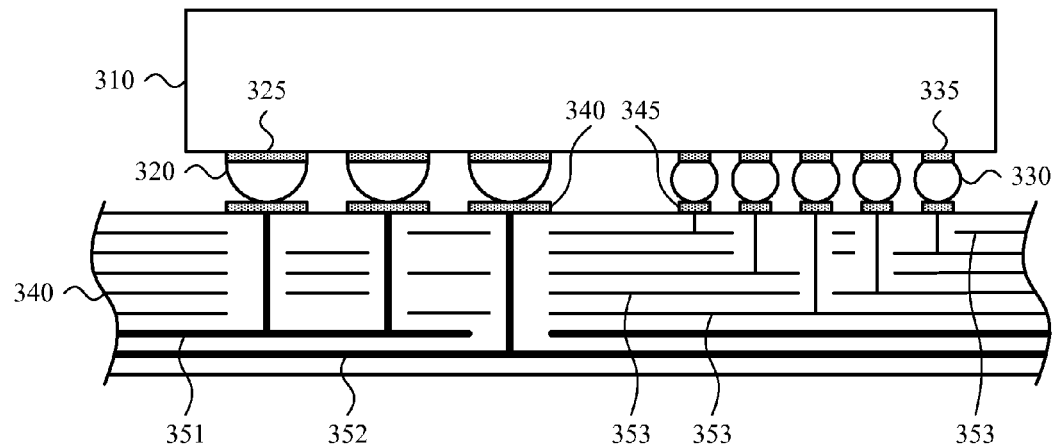
FIG. 3B is a diagrammatic side view of a die applied to a printed circuit board after the die is singulated from the wafer shown in FIG. 3A.

After the solder bumps 320, 330 have been formed on the active surface of the wafer 300 and all other wafer level processes have been completed, the dice are singualted from the wafer. Thereafter, individual dice may be applied to appropriate substrates, such as printed circuit boards, for mounting and/or packaging. FIG. 3B is a diagrammatic side view of a single die applied to a printed circuit board after the die is singulated from the wafer shown in FIG. 3A. The printed circuit board 340 is shown here only as an example, and other types of substrate may also be used. Because heights of the larger solder bumps 320 and the smaller solder bumps 330 are approximately the same, the die 310 may be applied to the printed circuit board 340 evenly.

There are bond pads 340, 345 of different sizes formed on the surface of the printed circuit board 340, which correspond to the solder bumps 320, 330. Again, generally, the larger bond pads 340 are associated with the larger solder bumps 320, and the smaller bond pads 345 are associated with the smaller solder bumps 330.

The printed circuit board 340 may have various ground, power, or signal lines. For example, in FIG. 3B, the printed circuit board 340 has a power line 351, a ground line 352, and several signal lines 353. The larger solder bumps 320 are connected to the power line 351 and the ground line 352 respectively, so that after they are reflowed, they create connections that may carry higher current, such as current greater than or equal to 10 Amperes. The smaller solder bumps 330 are connected to the signal lines 353 respectively, so that after they are reflowed, they create connections that are suitable for the signal lines 353.

Figure 3C:
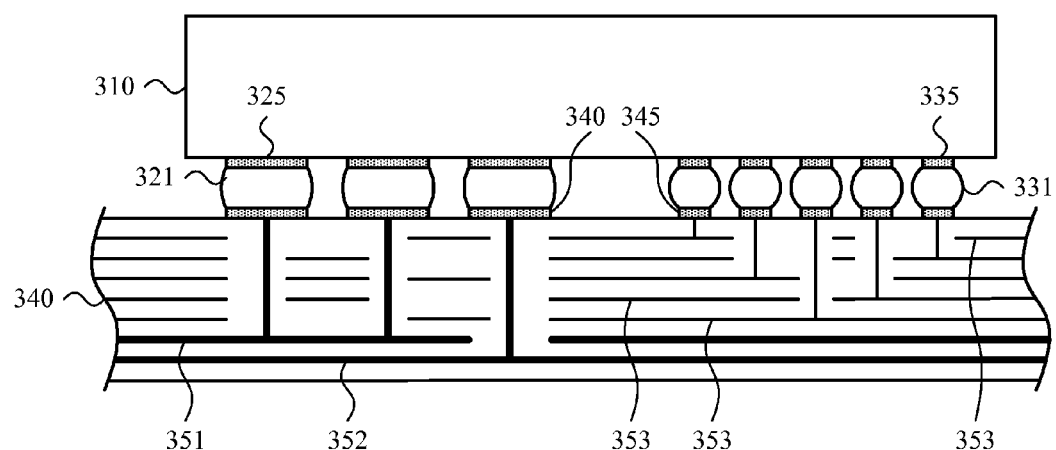
FIG. 3C is a diagrammatic side view of the arrangement shown in FIG. 3B after the solder bumps have been reflowed to create electrical connections between the die and the printed circuit board.

FIG. 3C is a diagrammatic side view of the arrangement shown in FIG. 3B after the solder bumps have been reflowed to create electrical connections between the die and the printed circuit board. Electrical connections 321, 331 are created between the die 310 and the printed circuit board 340 at the appropriate locations via the reflowed solder bumps. As will be appreciated by those skilled in the art, the shape of the connections 321, 331 may be affected by the following factors: the surface tension of the solder material (i.e., solder paste) used, the amount (i.e., volume) of the solder material used, and the sizes of the bond pads for the solder bumps both on the die and on the substrate. Generally, the bond pads for the solder bumps are completely filled with solder material.

It is important that the die 310 is mounted to the substrate 340 evenly. This requires that when the different sized solder bumps 320, 330 are reflowed to form connections between the die 310 and the substrate 340, the connections have approximately the same height. On the other hand, because the solder bumps 320, 330 are of different sizes, the electrical connections 321, 331 between the die 310 and the substrate 340 formed by the solder bumps 320, 330 are likely of different widths, with larger solder bumps 320 forming wider electrical connections 321 and smaller solder bumps 330 forming narrower electrical connections 331. As explained above, one way to achieve this desired result is that when the different sized solder bumps 320, 330 are formed on the wafer 300, they should have approximately the same height.

However, the method described above (i.e., maintaining height consistency between the larger and smaller solder bumps 325, 335 when the solder bumps are formed on the wafer) is not the only way to achieve even mounting of the die 310 on the substrate 340 after the solder bumps are reflowed. It is possible for the die 310 to be mounted on the substrate 340 evenly even if the solder bumps formed on the wafer have different heights. For example, it is possible, although perhaps unlikely, to have solder bumps of different sizes and heights formed both on the wafer and the substrate at corresponding positions in such a way that when all the solder bumps are reflowed for form connections between the die and the substrate, all the connections end up have approximately the same height.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings. For example, FIGS. 3A-3C have described surface-mount packaging of the dice, where a die is surface mounted to a printed circuit board. However, the concept may be extended to ball grid array (BGA) and/or pin grid array (PGA) packaging.

In addition, although FIGS. 1, 2, and 3A-3C all show solder bumps of two different shapes and sizes on a single die, solder bumps of additional shapes and/or sizes may be formed on a single die (i.e., solder bumps of three, four, or more shapes and/or sizes). The different shapes and/or sizes of the solder bumps may be determined by the types of connections (i.e., requirements of the device) they need to form. It is possible to have solder bumps of various shapes and/or sizes to form connections between the die and the substrate of approximately the same height after the solder bumps are reflowed.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A semiconductor device, comprising:
a die including an active surface;
a multiplicity of bond pads formed on the active surface of the die, wherein a first one of the bond pads is larger than a second one of the bond pads; and
a multiplicity of solder bumps, each formed over a corresponding bond pad and each having a spherical cap shape, wherein the multiplicity of solder bumps include a first solder bump formed over the first bond pad and a second solder bump formed over the second bond pad, the first solder bump having a footprint that is substantially larger than the second solder bump and a maximum diameter that is substantially larger than the diameter of second solder bump, and wherein the height of the first solder bump approximately equals the height of the second solder bump.

2. The semiconductor device, as recited in claim 1, wherein the first solder bump is approximately hemispherical shaped including a radius and a diameter, the second solder bump is approximately major spherical cap shaped including a radius and a diameter, and the radius of the first solder bump is approximately two times the radius of the second solder bumps.

3. The semiconductor device, as recited in claim 1, wherein the multiplicity of bond pads are approximately circular shaped, and the first bond pad is substantially larger than the second bond pad.

4. The semiconductor device, as recited in claim 1, further comprising:
a multiplicity of under-bump metallization stacks, each formed over a corresponding bond pad, wherein each solder bump is attached to an associated under-bump metallization stack.

5. The semiconductor device, as recited in claim 1, further comprising:
a first multiplicity of solder bumps, each same as the first solder bump and each formed over a corresponding bond pad same as the first bond pad; and
a second multiplicity of solder bumps, each same as the second solder bump and each formed over a corresponding bond pad same as the second bond pad.

6. A semiconductor package, comprising:
a semiconductor device comprising
a die including an active surface;
a first multiplicity of bond pads and a second multiplicity of bond pads formed on the active surface of the die, wherein the bond pads in the first multiplicity of bond pads are larger than the bond pads in the second multiplicity of bond pads; and
a multiplicity of solder bumps, each formed over a corresponding bond pad, wherein the multiplicity of solder bumps include a first plurality of solder bumps, each first solder bump being formed over an associated first bond pad and a second plurality of solder bumps, each second solder bump being formed over an associated second bond pad, the first solder bumps each having a footprint that is substantially larger than the footprint of second solder bumps and a maximum diameter that is substantially larger than the diameter of second solder bumps; and
a substrate comprising
a multiplicity of contact pads formed on a surface of the substrate, wherein a first one of the contact pads is larger than a second one of the contact pads
at least one power line, each connected to a corresponding first contact pad;
at least one ground line, each connected to a corresponding first contact pad; and
at least one signal line, each connected to a corresponding second contact pad,
wherein the semiconductor device is mounted on the surface of the substrate, such that each of the multiplicity of solder bumps of the semiconductor device is connected to a corresponding contact pad of the substrate, wherein the first solder bump of the semiconductor device is connected to a corresponding first contact pad, and the second solder bump of the semiconductor device is connected to a corresponding second contact pad.

7. The semiconductor package, as recited in claim 6, wherein connections between the semiconductor device and the substrate formed by reflowing the multiplicity of solder bumps have approximately the same height.

8. The semiconductor package, as recited in claim 7, wherein the connections between the semiconductor device and the substrate have different widths, such that the larger solder bump forms a corresponding wider connection and the smaller solder bump forms a corresponding narrower connection.

9. The semiconductor package, as recited in claim 6, wherein the multiplicity of contact pads are approximately circular shaped, and the first contact pad is substantially larger than the second contact pad.

10. The semiconductor package, as recited in claim 6, wherein the height of the first solder bump approximately equals the height of the second solder bump.

11. The semiconductor package, as recited in claim 6, wherein the heights of the first and second solder bumps are selected such that after the solder bumps are reflowed to attach the die to a substrate, the heights of the reflowed first and second solder bumps are approximately the same.

12. The semiconductor package, as recited in claim 6, wherein
the first solder bump is approximately hemispherical shaped including a radius and a diameter,
the second solder bump is approximately major spherical cap shaped including a radius and a diameter, and
the radius of the first solder bump is approximately two times the radius of the second solder bumps.

13. The semiconductor package, as recited in claim 6, wherein the multiplicity of bond pads are approximately circular shaped, and the first bond pad is substantially larger than the second bond pad.

14. A method of mounting a die to a substrate, comprising:
placing the die having a multiplicity of solder bumps of two different sizes, each solder bump having a spherical cap shape and having approximately the same height, on the substrate having a multiplicity of contact pads having two different sizes, wherein a larger solder bump corresponds to a larger contact pad, and a smaller solder bump corresponds to a smaller contact pad; and
reflowing the multiplicity of solder bumps to connect the die to the substrate,
wherein connections formed by reflowing the multiplicity of solder bumps have approximately the same height.

15. The method, as recited in claim 14, wherein
the multiplicity of solder bumps include at least one larger solder bump that is approximately hemispherical shaped and at least one smaller solder bump that is approximately major spherical cap shaped, and
the radius of the at least one larger solder bump is approximately two times the radius of the at least one smaller solder bump.

16. The method, as recited in claim 14, wherein the connections formed by reflowing the multiplicity of solder bumps have two different widths, such that the larger solder bump forms a corresponding wider connection and the smaller solder bump forms a corresponding narrower connection.

\* \* \* \* \*